(12) United States Patent
Fourkas et al.

(10) Patent No.: US 8,298,445 B2
(45) Date of Patent: Oct. 30, 2012

(54) MICROSTRUCTURES, MICRODEVICES AND RELATED METHODS

(75) Inventors: John T. Fourkas, Bethesda, MD (US); Richard A. Farrer, Pueblo, CO (US)

(73) Assignee: The Trustees of Boston College, Chestnut Hill, MA (US)

( * ) Notice: Subject to any disclaimer, the term of this patent is extended or adjusted under 35 U.S.C. 154(b) by 536 days.

(21) Appl. No.: 11/852,831

(22) Filed: Sep. 10, 2007

(65) Prior Publication Data

US 2008/0113196 A1    May 15, 2008

Related U.S. Application Data

(63) Continuation of application No. PCT/US2006/007125, filed on Feb. 28, 2006.

(60) Provisional application No. 60/661,204, filed on Mar. 11, 2005, provisional application No. 60/660,730, filed on Mar. 11, 2005.

(51) Int. Cl.
*G01N 33/00* (2006.01)

(52) U.S. Cl. ........ 252/511; 977/700; 977/701; 977/702; 977/705; 977/712; 977/732

(58) Field of Classification Search ................. None
See application file for complete search history.

(56) References Cited

U.S. PATENT DOCUMENTS 7,008,563 B2 *   3/2006   Smalley et al. ............... 252/511

FOREIGN PATENT DOCUMENTS

| EP | 1 403 214 A2 | 3/2004 |
|---|---|---|
| WO | WO 03/006948 A2 | 1/2003 |
| WO | WO 03/060988 A1 | 7/2003 |

OTHER PUBLICATIONS

Hahm et al.(Nano Letters 2004 vol. 4, No. 1 51-54).*
Baldacchini et al. (Journal of Applied Physics, vol. 95, No. 11 pp. 6072-6076).*
Feng et al. (Carbon 41 (2003) 2385-2391).*
Baldacchini et al., "Acrylic-based resin with favorable properties for three-dimensional two-photon polymerization", Journal of Applied Physics, vol. 95, No. 11, pp. 6072-6076, Jun. 1, 2004.
LaFratta et al., "Replication of Two-Photon-Polymerized Structures with Extremely High Aspect Ratios and Large Overhangs", J. Phys. Chem. B., vol. 108, pp. 11256-11258, 2004.
Esplandiu et al., "Functionalized Self-Assembled Alkanethiol Monolayers on Au(111) Electrodes: 1. Surface Structure and Electrochemistry", Langmuir, vol. 17, pp. 828-838, 2001.
McDonald et al., "Poly(dimethylsiloxane) as a Material for Fabricating Microfluidic Devices", Accounts of Chemical Research, vol. 35, No. 7, pp. 491-499, Jul. 2002.
Homola et al., "Surface plasma resonance sensors: review", Sensors and Actuators B, vol. 54, pp. 3-15, 1999.
LaFratta et al., "Three-Dimensional Micro- and Nanofabrication with Multiphoton Absorption", Mater. Res. Soc. Proc., vol. 850, pp. 199-204, 2005.
Baldacchini et al., "Fabrication and Metallization of Three-Dimensional Microstructures", Mater. Res. Soc. Proc., vol. EXS-2, pp. 159-161, 2004.

(Continued)

*Primary Examiner* — Jill Warden
*Assistant Examiner* — Monique Cole
(74) *Attorney, Agent, or Firm* — Fish & Richardson P.C.

(57) ABSTRACT

Microstructures, microdevices and related methods are disclosed.

27 Claims, 4 Drawing Sheets

OTHER PUBLICATIONS

Saito et al., "Low-Temperature Fabrication of Light-Emitting Zinc Oxide Micropatterns Using Self-Assembled Monolayers", Adv. Mater., vol. 14, No. 6, pp. 418-421, Mar. 18, 2002.

Menon et al., "Fabrication and Evaluation of Nanoelectrode Ensembles", Anal. Chem., vol. 67, pp. 1920-1928, 1995.

Paul C. Painter, *Fundamentals of Polymer Science* (Technomic, 1997), p. 31.

Seyhan Ege, *Organic Chemistry* (D.C. Heath and Co, 1994), pp. 1258-1259.

Steven S. Zumdahl, *Chemical Principles* (D.C. Heath and Co, 1995), p. 751.

* cited by examiner

US 8,298,445 B2

MICROSTRUCTURES, MICRODEVICES AND RELATED METHODS

CROSS REFERENCE TO RELATED APPLICATIONS

This application is a continuation of (and claims the benefit of priority under 35 USC 0$120) of PCT/US2006/007125, filed Feb. 28, 2006, which claims priority from U.S. Provisional Patent Application No. 60/661,204, filed on Mar. 11, 2005 and U.S. Provisional Patent Application No. 60/660,730, filed on Mar. 11, 2005, the contents of each of which is incorporated herein by reference in its entirety.

STATEMENT OF FEDERALLY SPONSORED RESEARCH

This invention was made with government support under National Science Foundation grant numbers ECS-0088438 and ECS-0210497. The government has certain rights in the invention.

TECHNICAL FIELD

The invention generally relates to microstructures, microdevices and related methods.

BACKGROUND

Articles, such as wires, that have a maximum dimension of about 100 microns or less are commonly referred to as microstructures. Devices, such as sensors, that contain microstructures are commonly referred to as microdevices.

SUMMARY

In general, the invention relates to microstructures, microdevices and related methods.

In some embodiments, a microstructure includes a polymer substrate having portions formed of different polymers. The reactivities of the polymers toward certain chemical species can be different. As a result, the surface of the polymer substrate can be selectively functionalized (chemically modified) by exposing the polymer substrate to one or more chemical species that reacts with a given polymer but does not react with a different polymer. After exposure to the chemical species, the surface of the polymer substrate can have functionalized surface regions (corresponding to surface regions of a polymer that is reactive toward the chemical species) and substantially unfunctionalized regions (corresponding to surface regions of a polymer that is not reactive toward the chemical species). The functionalized and substantially unfunctionalized surface regions of the polymer substrate can, in turn, exhibit different reactivities toward certain chemical species, such as precursors of coating materials. Thus, a coating can be formed on functionalized surface regions of the polymer substrate without forming a coating on the substantially unfunctionalized regions of the polymer substrate, or vice-versa. The ability to preselect regions of the polymer substrate surface where coatings will and will not be formed, allows the polymer substrate to be used in the formation of fully functional, three dimensional microdevices.

In certain embodiments, a microstructure can be manufactured using irradiation techniques, such as multiphoton absorption polymerization (MAP), to form the polymer substrate. Such techniques can allow for microstructure formation in a relatively uncomplicated, inexpensive, fast, high throughput, and/or well controlled manner. The processes can be used to integrate one or more microstructures with other components in a microdevice, or the processes can be used to form an entire microdevice having multiple, integrated microstructures. Optionally, the processes can be used to form such microstructures and/or microdevices in a substantially coplanar fashion (e.g., without having to build one or more microstructures vertically relative to other components in the microdevice).

In some embodiments, a microstructure has a polymer substrate that does not have different regions formed of different polymers (e.g., the polymer substrate is formed of a single polymer or a polymer mixture that is substantially homogeneous across the relevant surface region of the polymer substrate). As an example, a microstructure, such as a wire, can be formed using irradiation techniques (e.g., MAP) to provide a polymer substrate, followed by functionalization of one or more regions of the polymer substrate surface and subsequent coating formation. The above-noted advantages of such irradiation techniques can also apply to such microstructures.

Certain aspects of the invention are as follows.

In one aspect, the invention features an article that includes a polymer substrate and a coating supported by the polymer substrate. The coating includes a material different from the polymer substrate, and the maximum dimension of the article is about 100 microns or less.

In another aspect, the invention features a microdevice that includes two components and an article (e.g., a wire) that is operatively associated with the other two components. The article includes a polymer substrate and a coating supported by the polymer substrate. The coating includes a material different from the polymer substrate, and the maximum dimension of the article is about 100 microns or less.

In a further aspect, the invention features a substrate in the form of an article (e.g., a wire) that has a first region and a surface region supported by the first region. The first region includes a polymer, and the surface region includes a material different from the polymer. The substrate has a maximum dimension of about 100 microns or less.

In an additional aspect, the invention features a microdevice that includes two components and an article (e.g., a wire) that is operatively associated with the other two components. The article has a first region and a surface region supported by the first region. The first region includes a polymer, and the surface region includes a material different from the polymer. The substrate has a maximum dimension of about 100 microns or less.

In another aspect, the invention features a method of forming an article (e.g., a wire). The method includes irradiating a prepolymer of a first polymer and a prepolymer of a second polymer to form first and second portions of the article. The first portion includes the first polymer, and the second portion includes the second polymer. The first polymer is different from the second polymer.

In a further aspect, the invention features a method of forming an article (e.g., a wire). The method includes: irradiating a prepolymer of a first polymer to form a first portion of the article including the first polymer; removing excess prepolymer of the first polymer, if present; irradiating a prepolymer of a second polymer to form a second portion of the article including a second polymer, the second polymer being different from the first polymer; removing excess prepolymer of the second polymer, if present; and functionalizing at least some of the first polymer.

In another aspect, the invention features a microdevice that includes two components and a third component that is operatively associated with the other two components. The third component is an article that includes a polymer substrate and a coating supported by the polymer substrate. The coating includes a material different from the polymer substrate, and the maximum dimension of the article is about 100 microns or less.

In a further aspect, the invention features a substrate that has a first region and a surface region supported by the first region. The first region includes a polymer, and the surface region includes a material different from the polymer. The substrate has a maximum dimension of about 100 microns or less.

In an additional aspect, the invention features a microdevice that includes two components and a third component that is operatively associated with the other two components. The third component is a substrate that has a first region and a surface region supported by the first region. The first region includes a polymer, and the surface region includes a material different from the polymer. The substrate has a maximum dimension of about 100 microns or less.

In one aspect, the invention features a microdevice that includes two electrical conductors and an electrically conductive wire in electrical communication with the two electrical conductors. The electrically conductive wire includes a polymer substrate and an electrically conductive coating supported by the polymer substrate. The electrically conductive wire has a maximum dimension of about 100 microns or less.

In another aspect, the invention features a method of forming an article. The method includes irradiating a prepolymer of a first polymer and a prepolymer of a second polymer to form first and second portions of the article. The first portion includes the first polymer, and the second portion includes the second polymer. The first polymer is different from the second polymer.

In a further aspect, the invention features a method of forming an article. The method includes: irradiating a prepolymer of a first polymer to form a first portion of the article including the first polymer; removing excess prepolymer of the first polymer, if present; irradiating a prepolymer of a second polymer to form a second portion of the article including a second polymer, the second polymer being different from the first polymer; removing excess prepolymer of the second polymer, if present; and functionalizing at least some of the first polymer.

In another aspect, the invention features a method that includes disposing an electrically conductive connector between electrical conductors, the electrically conductive connector including a polymer substrate and an electrically conductive coating supported by the polymer substrate, the electrical connection having a maximum dimension of about 100 microns or less.

In an additional aspect, the invention features a method that includes using MAP to form an article having first and second portions, the first portion including a first polymer, the second portion including a second polymer that is different from the first polymer, the article having a maximum dimension of about 100 microns or less.

All publications, patent applications, patents, and other references mentioned herein are incorporated by reference in their entirety. In case of conflict, the present specifications control.

Other features and advantages will be apparent from the description, drawings and claims.

DESCRIPTION OF DRAWINGS

Like reference symbols in the various drawings indicate like elements.

DETAILED DESCRIPTION

Figure 1:
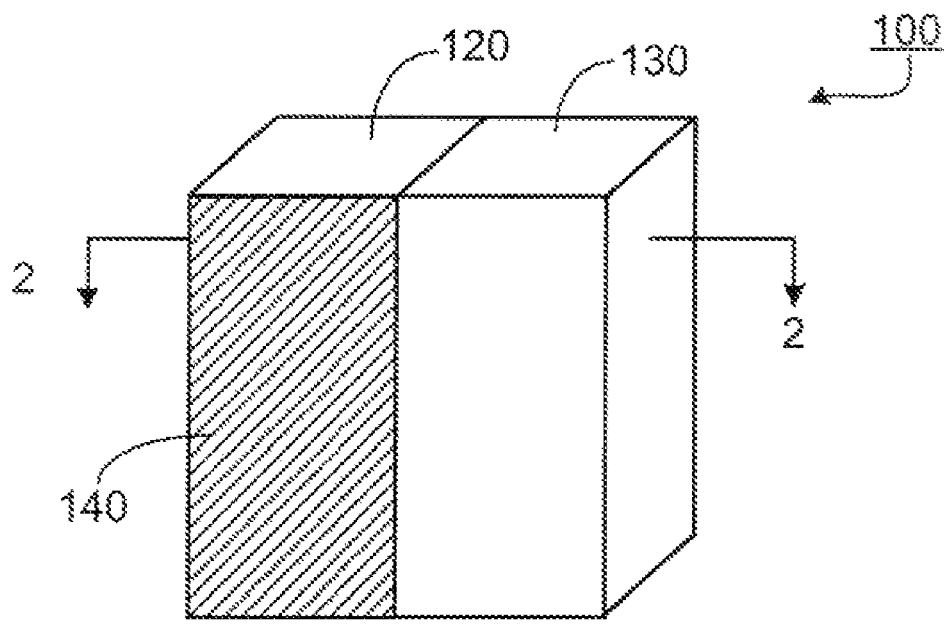
FIGS. 1 and 2 are perspective and cross-sectional views, respectively, of a microstructure.
Figure 2:
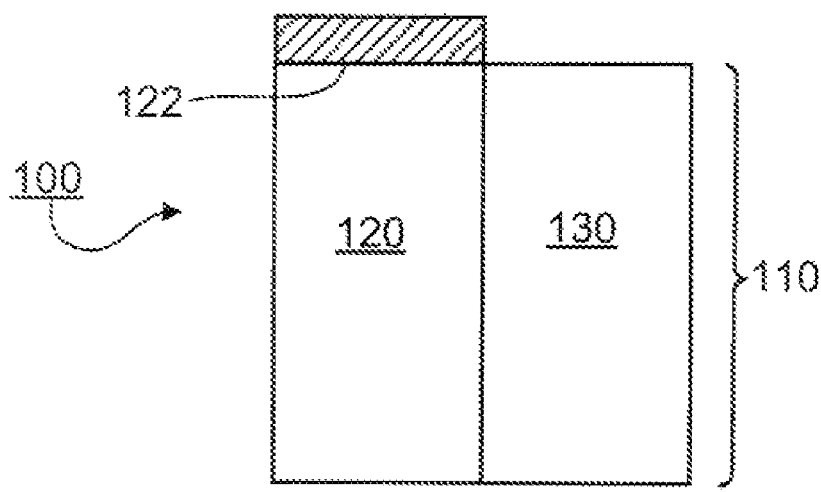

FIGS. 1 and 2 show a microstructure 100 in the form of a pad. In general, the maximum dimension of microstructure 100 in the x, y or z direction is about 100 microns or less (e.g., about 50 microns or less, about 10 microns or less, about one micron or less, about 500 nanometers or less, about 250 nanometers or less, about 100 nanometers or less, about 50 nanometers or less, about 40 nanometers or less, about 30 nanometers or less, about 20 nanometers or less, about 10 nanometers or less).

Microstructure 100 includes a substrate 110 having portions 120 and 130 that are covalently bonded together, and a coating 140 covalently bonded to a surface 122 of portion 120.

Portions 120 and 130 are formed of different polymers. In general, portion 120 is formed of a polymer that reacts with certain chemical species (e.g., thiols, conjugate bases of thiols, amines, conjugate bases of amines, carboxyls) under appropriate reaction conditions so that the surface region of portion 120 becomes functionalized. In contrast, portion 130 is generally formed of a polymer that remains substantially unfunctionalized when exposed to the same chemical species and reaction conditions that functionalize the surface region of portion 120. For example, in some embodiments, the polymer that forms portion 120 is at least about five times (e.g., at least about 10 times, at least about 20 times) more reactive to the chemical species under the selected reaction conditions (i.e., toward becoming functionalized) than is the polymer that forms portion 130.

Examples of polymers from which portion 120 can be formed include polyacrylates, polymethacrylates, epoxies, polythiophenes, and polystyrenes.

Examples of polymers from which portion 130 can be formed include polyacrylates, polymethacrylates, epoxies, polythiophenes, and polystyrenes.

As an example, in some embodiments, portion 120 is formed of a polyacrylate, and portion 130 is formed of a polymethacrylate. As another example, in certain embodiments, portion 120 is formed of a polymethacrylate, and portion 130 is formed of a polyacrylate. As a further example, in some embodiments, portion 120 is formed of a polyacrylate, and portion 130 is formed of an epoxy. As an additional example, in certain embodiments, portion 120 is formed of a polymethacrylate, and portion 130 is formed of an epoxy.

In general, coating 140 can be formed of any desired material. In some embodiments, coating 140 is formed of an electrically conductive and/or magnetic material, such as a metal, an alloy, an intermetallic or a polymer. Examples of metals include gold, copper, silver, palladium, cobalt, platinum and nickel. Examples of alloys include alloys containing one or more of the aforementioned metals, such as silver/gold alloys. Examples of polymers include polythiophenes and polyphenylenevinylenes. In certain embodiments, coating 140 is formed of a biological material, such as an oligonucleotide, a peptide, a protein, an antibody, an enzyme, a saccharide, or a lipid. In some embodiments, coating 140 is formed of an inorganic material, such as, for example, a metal oxide, a metal telluride or an inorganic oxide (e.g., zinc oxide, cadmium telluride, titanium dioxide, silicon dioxide).

While FIGS. 1 and 2 show a three-dimensional microstructure in the form of a pad, other three dimensional microstructures having the features noted above are possible. Such three dimensional microstructures include, for example, wires, chains, coils, tubes, channels, reaction vessels, funnels, cables, band gaps, gears, cantilevers, pipes, towers and nanomanipulators.

Figure 3:
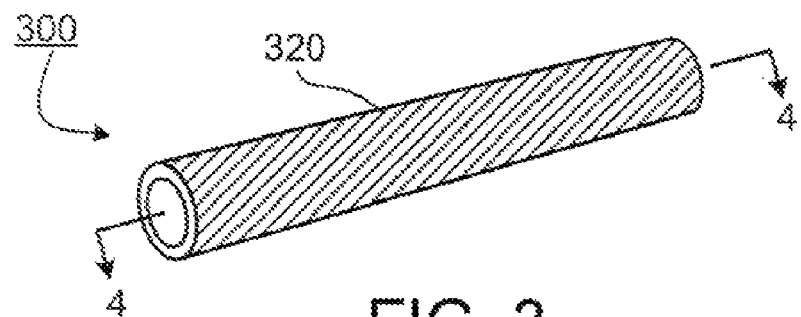
FIGS. 3 and 4 are perspective and cross-sectional views, respectively, of a microstructure.
Figure 4:
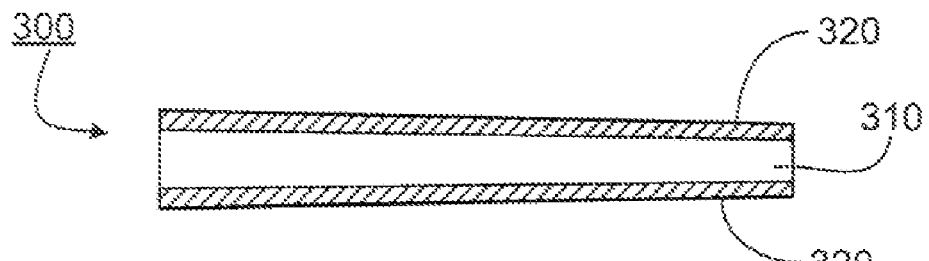

Moreover, while embodiments have been described in which a three-dimensional microstructure is formed of a substrate that includes regions formed of two different polymers, in some embodiments, the polymer substrate does not include regions formed of two different polymers. For example, the polymer substrate can be formed of a single polymer or a mixture (e.g., a substantially homogeneous mixture) of polymers. FIGS. 3 and 4 show a three dimensional microstructure 300 in the form of a wire that includes a polymer substrate 310 having a surface 312 that is covalently bonded to a coating 320.

Further, while embodiments have been shown in which a coating of uniform thickness is formed a surface region of a polymer substrate, in some embodiments, the coating can have a nonuniform thickness. For example, in some embodiments, a coating can have a varying thickness. In certain embodiments, a coating can have one or more openings. Generally, the coating will be configured to provide its desired function. As an example, in embodiments in which a coating is formed of an electrically conductive material, while the coating may not have a uniform thickness (e.g., may have a varying thickness and/or openings), the coating will generally be configured to provide the desired degree of electrical conductivity (e.g., by having one or more continuous paths for electrical current in the desired direction).

Figure 5:
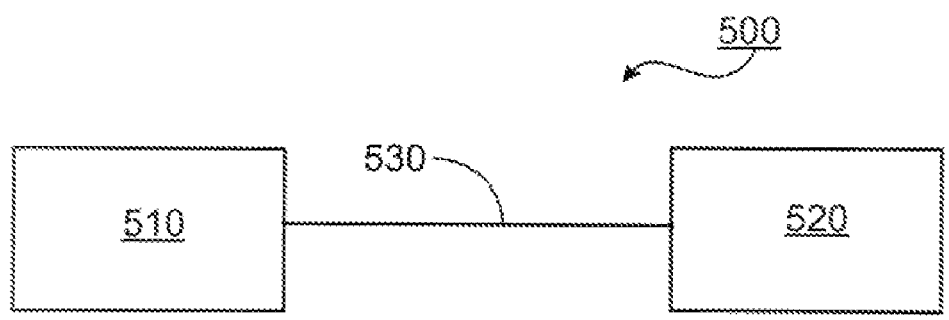
FIG. 5 is a schematic representation of a microdevice.

One or more microstructures can be included in (e.g., as integral component of) a microdevice, such as a sensor (e.g., a surface plasmon sensor, a biosensor, a micro NMR probe, a cantilever array, or a magnetic resonance force microscopy probe). Surface plasmon sensors are disclosed, for example, in co-pending and commonly owned U.S. Ser. No. 60/657,053, filed Feb. 28, 2005, which is hereby incorporated by reference. For example, FIG. 5 shows a microdevice 500 that includes two components 510 and 520 that are operatively connected by a microstructure 530. As an example, microdevice 500 can be a sequence-specific DNA sensor in which components 510 and 520 are polymers (e.g., polyacrylates) that have been metallized to make wires, and microstructure 530 is a metallic (e.g., gold) nanorod that has been coated with a probe sequence of DNA. As another example, microdevice 500 can be a protein sensor in which components 510 and 520 are polymers (e.g., polyacrylates) that have been metallized to make wires, and microstructure 530 is a metal (e.g., gold) nanorod that has been coated with antibodies to a particular protein. As a further example, microdevice 500 can be a polarization-selective light sensor in which components 510 and 520 are polymers (e.g., polyacrylates) that have been metallized to make wires, and microstructure 530 is a zinc oxide nanorod. As an additional example, microdevice 500 can be a gas sensor in which components 510 and 520 are polymers (e.g., polyacrylates) that have been metallized to make wires, and microstructure 530 is a carbon nanotube.

In general, a microstructure can be manufactured as follows. A mixture containing a first prepolymer (e.g., a monomer, such as a methacrylate monomer) is irradiated with a laser at appropriate wavelength and intensity to polymerize the first prepolymer in a desired shape (e.g., to form a first portion of the polymer substrate). Excess of the first prepolymer is removed from the polymerized sample. A mixture containing a second prepolymer (e.g., a monomer, such as an acrylate monomer) is disposed adjacent the polymerized sample, and the second prepolymer is irradiated with a laser at appropriate wavelength and intensity to polymerize the second prepolymer in a desired shape (e.g., to form a second portion of the polymer substrate). The first and second prepolymers are typically selected so that the corresponding polymerized portions are covalently bonded to each other.

In some embodiments, the mixture of the first prepolymer contains a monomer (e.g., a difunctional monomer, a trifunctional monomer, a tetrafunctional monomer, a pentafunctional monomer), a photoinitiator (e.g., Lucirin TPO-L, 1-hydroxycyclohexyl phenyl ketone, or 2,2-diethoxyacetophenone), a co-initiator (e.g., triethanolamine), and an inhibitor (e.g., BHT, which can be incorporated within the monomers to keep them from spontaneously polymerizing). In general, the functionality of the first prepolymer is selected so that, after polymer formation, unreacted moieties can covalently bond to the prepolymer that forms the second portion of the polymer substrate, and so that, after the polymer substrate is formed, some of the functionality first prepolymer remains available for functionalization.

This mixture is disposed on an appropriate surface (e.g., a prepared microscope coverslip, see examples below). The mixture is then developed using MAP. A typical MAP procedure is as follows. An appropriate laser oscillator, such as a tunable laser oscillator, is selected. An example of a laser oscillator is a Ti:Sapphire laser oscillator (e.g., the Mira™ Optima™ 900-F laser oscillator with 100 femtosecond (fs) pulses, available from Coherent, Inc., Santa Clara, Calif.). The laser output is directed through appropriate optics (e.g., a Faraday isolator, a prism dispersion compensator and a beam expander) and then introduced to a microscope (e.g., through a reflected light port to the microscope). An example of a microscope is an upright microscope, such as the Ax-ioPlan2 upright microscope, available from Zeiss. The position of a focal volume is controlled with a computerized stage (e.g., a LUDL BioPrecision motorized microscope stage available from SpectraCore, Inc.). If desired, the sample can be visualized during fabrication by using, for example, a charge-coupled device camera. The focus of the laser beam is moved in a three-dimensional pattern to provide the desired shape of the first portion of the polymer substrate. MAP procedures are described, for example, in *J. Appl. Phys.*, 95(11), 6072-6076 (2004) and *J. Phys. Chem. B*, 108, 11256-11258 (2004), which is hereby incorporated by reference.

Excess of the prepolymer, if present, is removed. The excess prepolymer can be removed, for example, by washing with an appropriate liquid, such as deionized water, dimethylformamide (DMF) and/or ethanol.

The mixture of the second prepolymer contains a monomer (e.g., a difunctional monomer, a trifunctional monomer, a tetrafunctional monomer, a pentafunctional monomer), a photoinitiator (e.g., Lucirin TPO-L, 1-hydroxycyclohexyl phenyl ketone, or 2,2-diethoxyacetophenone), a co-initiator (e.g., triethanolamine), an inhibitor (e.g., BHT, which can be incorporated within the monomers to keep them from spontaneously polymerizing). Generally, the functionality of the second prepolymer is selected so that it can covalently bond to the portion of the polymer substrate formed from the first prepolymer.

In general, the first and second prepolymers are selected so that surface regions of the first and second portions of the polymer substrate have different reactivity to particular reagents, allowing for selective functionalization of the surface of the polymer substrate. For example, the surface of one portion of the polymer substrate (e.g., a polyacrylate surface) may be capable of being functionalized with certain chemical species (e.g., nucleophiles or electrophiles). Examples of nucleophiles include thiols, conjugate bases of thiols, amines, conjugate bases of amines, and carboxyls. In embodiments in which the surface of a portion of the polymer substrate includes at least one functional group with an olefinic group, functionalization can be performed using olefin metathesis. Additionally, epoxidation and/or metathesis can be used to selectively functionalize groups.

After functionalizing one or more surface regions of the polymer substrate, the coating is formed on the functionalized surface regions of the polymer substrate. In general, the chemical species used to functionalize the surface region(s) of the polymer substrate is(are) selected based on its(their) reactivity with the relevant polymer(s) and with the precursor of the coating material. As an example, when the functionalized region of the region of the surface of the polymer substrate is functionalized with ethylene diamine (e.g., acrylate groups functionalized with ethylene diamine), and the substantially unfunctionalized region of the surface of the polymer substrate is formed of substantially unfunctionalized material (e.g., substantially unfunctionalized methacrylate groups), the diamine-functionalized groups can be selectively reacted with metal compounds to form a metallic coating. Exemplary metal compounds that can be used include palladium compounds (e.g., palladium chloride), copper compounds (e.g., copper sulfate), silver compounds (e.g., silver nitrate, silver perchlorate) and gold compounds (e.g., hydrogen tetrachloroaurate, gold nanoparticles).

In some embodiments, electrically conductive coatings are prepared by initially introducing either palladium chloride or hydrogen tetrachloroaurate to a diamine-functionalized polymer. In addition to this first treatment, additional enhancement can advantageously be used to make the system conductive. The enhancement step can provide an array of different metal coatings including, for example, gold, copper, silver, nickel, cobalt, palladium, and platinum.

In some embodiments, an inorganic coating (e.g., a ZnO coating) can be formed using the methods disclosed in *Adv. Mat.*, 14(6), 418 (2002).

Microstructures (e.g., wires) in which the polymer substrate does not have regions formed of different polymers can be manufactured using the general procedures described above, except without the use of different steps to introduce portions of the polymer substrate formed of different polymers.

While certain embodiments have been described, other embodiments are possible.

As an example, while embodiments have been described in which a coating is been covalently bonded to a functionalized region of the surface of the polymer substrate, in some embodiments, the coating can be covalently bonded to the substantially unfunctionalized region of the polymer substrate. That is, the functionalized surface region of the polymer substrate can be less reactive (e.g., at least about five times less reactive, at least about 10 times less reactive, at least about 20 times less reactive) toward the precursor of the coating material than the substantially unfunctionalized surface region of the polymer substrate.

As another example, while polymer substrates have been described that include first and second portions formed of different polymers, in some embodiments, a polymer substrate can include more than two portions formed of different polymers. For example, a polymer substrate can include at three or more (e.g., four or more, five or more, six or more, seven or more, eight or more, nine or more, 10 or more, 11 or more, 12 or more, 13 or more, 14 or more, 15 or more) portions formed of different polymer substrates. Such microstructures can be formed using the methods described above by adding appropriate steps to the process for each additional portion of the polymer substrate.

As a further example, while polymer substrates have been described in which the portions formed of different polymers are covalently bonded to each other, in some embodiments the portions of the substrate formed of different polymers are not covalently bonded to each other. For example, the portions of a substrate formed of different polymers can be bonded to each other using a tie layer.

As an additional example, while embodiments have been described in which portions of a polymer substrate are built in series (e.g., by processing a first prepolymer and then processing a second prepolymer), in some embodiments, portions of a polymer substrate can be concurrently prepared. For example, two prepolymers can be used to concurrently build two different portions of the polymer substrate (e.g., by using appropriate viscosities to substantially prevent mixing of the two prepolymers prior to polymer substrate formation).

As another example, while certain embodiments have been described in which a surface region of a portion of the polymer substrate is functionalized, in some embodiments, interior portions of a polymer substrate can be functionalized. For example, forming the structure from a water swellable polymer can allow for a functionalizing reagent to penetrate into the structure past the skin of the structure.

The following examples are illustrative and not intended to be limiting.

Example 1

A glass microscope coverslip was cleaned using an oxygen plasma cleaner (Harrick Scientific Basic Plasma Cleaner fitted with a PlasmaFlo™). The coverslips were placed in a coverslip holder and inserted into the chamber of the plasma cleaner. The cover to the chamber was put into place and vacuum was introduced to the chamber. Once the pressure of the vacuum chamber was stabilized, oxygen was allowed to flow into the chamber as a means of purging the chamber. After purging was complete, the oxygen flow was set at a rate that will support plasma production, and the RF dial was turned to high. The coverslips were left in the plasma for five minutes, after which the oxygen flow and the vacuum were shut off, and the chamber was allowed to equilibrate to atmospheric pressure. The coverslips were removed and stored in a clean sealed container.

A solution containing 95 mL of absolute ethanol, 5 mL of distilled water, and 3 mL of methacryloxypropyl trimethoxysilane (Gelest, Inc.) was prepared. This solution was stirred for 15 minutes prior to the addition of the cleaned coverslips, which were held in a Teflon coverslip holder. The surface modification was allowed to proceed for 24 hours at room temperature and pressure (the reaction vessel was covered to keep the ethanol from evaporating), after which the coverslips were removed from the solution and individually rinsed with absolute ethanol. The coverslips were placed in a glass Petri dish and baked at 125° C. for 1 hour. The coverslips were removed from the oven and stored in a dark place.

Two prepolymer resins were prepared. The first (resin #1) was a methacrylate resin consisting of 0.12 g of Lucirin® TPO-L (photoinitiator, BASF) and 4 g of SR348 (Sartomer). The second resin (resin #2) was an acrylate resin consisting of 0.12 g of Lucirin TPO-L (BASF), 1.72 g of SR368 (Sartomer), and 2.28 g of SR499 (Sartomer). Both resins were placed in a 125° C. oven for 15 minutes and shaken periodically in order to promote mixing. The resins were then removed from the oven and stored in a dark place.

A modified coverslip was taped to a microscope slide and a drop of resin #1 was placed on the coverslip. A second coverslip was placed on top of the resin creating a sandwich with the resin between the two coverslips and the tape acting as a spacer. A set of structures was fabricated by means of MAP on the modified coverslip. The sample was placed on a Zeiss Axioplan 2 Imaging microscope that was fitted with a mechanical LUDL stage for movement in the xy plane. Movement of the sample in the axial direction was controlled by a focusing motor that was incorporated into the Zeiss microscope. The beam produced by a Ti:sapphire laser system that produces ~100 fs pulsed at a repetition rate of 76 MHz at a wavelength of 800 nm (Coherent Mira Basic pumped by a Coherent 5 W Verdi) collimated to a size that overfills the back aperture of the objective used for the fabrication traversed a shutter and was sent through the rear port of the microscope. Once in the microscope, the beam traversed a dichroic mirror that directed the beam to the objective (any other optics that were present along this path have been removed). The beam was focused into the sample by an objective (10×, 20×, 40×, 40× oil, etc) in this case a 20× objective (Zeiss Plan NEOFLUAR) was used. The sample was positioned so that the focal point of the laser was at the point where polymerization commenced (at that point the shutter was closed so that the laser did not cause polymerization). All fabrication procedures were automated via LabView™ (National Instruments), and the structure was fed to the fabrication program by means of a text file. Once the fabrication was complete, the sample was removed from the microscope and disassembled so that the coverslip containing the fabricated structure was detached from the microscope slide.

The unpolymerized resin was removed by submerging the coverslip in two successive dimethylformamide (DMF) baths for 15 minutes each. The sample was then rinsed with absolute ethanol and allowed to dry.

Figure 6:
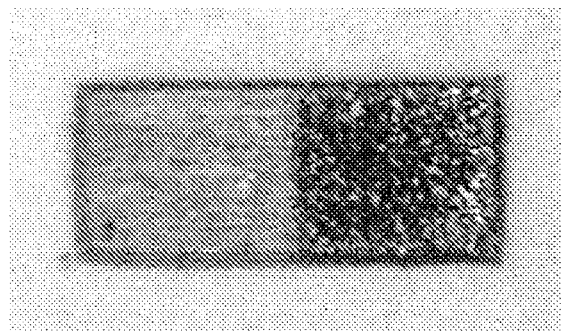
FIG. 6 is black and white rendering of an optical micrograph of a microstructure.

After drying, the coverslip was again taped to a microscope slide and a sandwich created with resin #2. A second set of structures was fabricated by the same method that was employed to fabricate the first structure. After fabrication, the sample was washed in dimethylformamide for the purpose of removing the unpolymerized resin. Then, the sample was rinsed in absolute ethanol, and placed in a solution of 20% v/v ethylene diamine in absolute ethanol. The reaction was stirred for one hour, after which the sample was rinsed thoroughly with absolute ethanol. The sample was then subjected to a saturated solution of palladium chloride in ethanol (filtered prior to use). The saturated palladium chloride solution contained 0.12 g $PdCl_2$ was dissolved in 100 mL of methanol (concentration of ~7 mmol). This solution was filtered prior to use. After one hour the sample was rinsed thoroughly with ethanol and then with deionized (DI) water. An electroless copper enhancement bath was prepared by mixing 4 g sodium hydroxide, 3 g copper sulfate, and 14 g sodium potassium tartrate in 100 mL of DI water. An activated bath was prepared by transferring 5 mL of this copper solution to a small beaker and adding 0.1 mL of formaldehyde (37% aqueous solution). The sample was placed in the activated bath for one minute, after which it was rinsed with DI water and allowed to dry. FIG. 6 is a black and white rendering of an optical micrograph taken with a digital camera attached to a microscope of the resulting pad, and shows that the copper selectively bonds to the acrylate polymer without bonding to the methacrylate polymer.

Example 2

Figure 7:
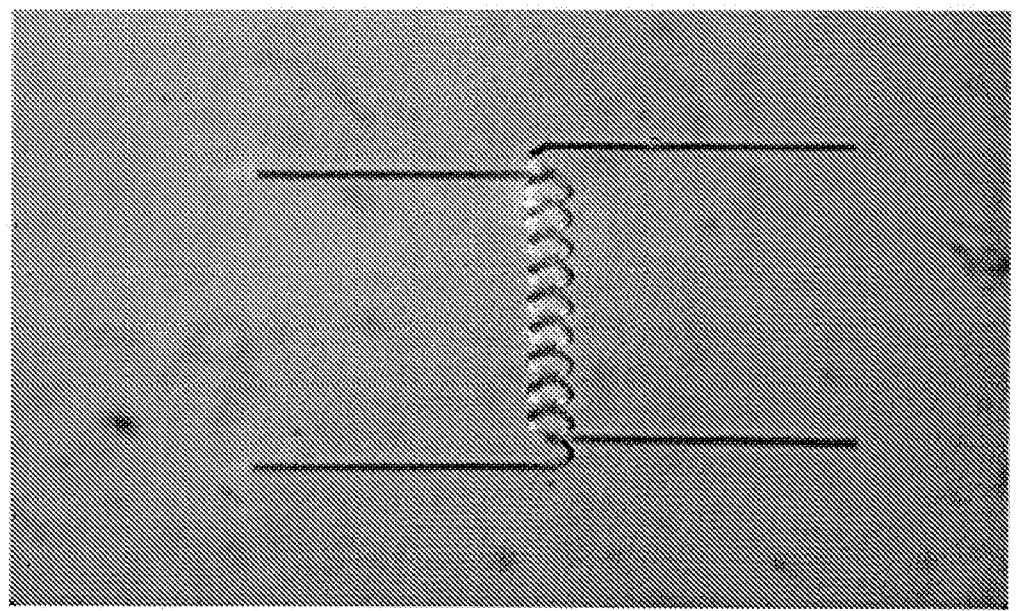
FIG. 7 is a black and white rendering of an optical micrograph of a microstructure.

Polymeric structures were prepared and treated with ethylene diamine and palladium chloride as described in Example 1. The sample was then submerged for 60 seconds in an electroless copper enhancement bath containing copper sulfate, sodium hydroxide, Rochelle's salt, and formaldyehyde. A stock solution containing 3 g of copper sulfate, 4 g of sodium hydroxide, and 14 g of Rochelle's salt in 100 mL of DI water was prepared. The activated enhancement bath, a 5:1 (stock solution:formaldehyde (37%) was prepared just prior to use. FIG. 7 shows a black and white rendering of an optical micrograph taken with a digital camera attached to a microscope of a pair of conductive coils created using this procedure. This figure again demonstrates the selectivity that can be achieved. The ethylene diamine reacts with the residual acrylate sites on the polymer, but does not react with the methacrylate functionality of the glass substrate.

Example 3

Figure 8:
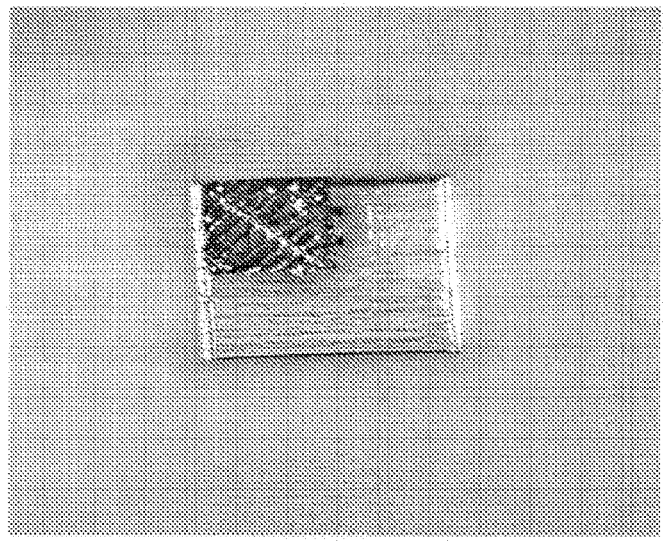
FIG. 8 is a black and white rendering an optical micrograph of a microstructure.

Polymeric structures were prepared and treated with ethylene diamine and palladium chloride as described in Example 1. An aqueous solution of 3-nm gold colloid stabilized with citrate ions was prepared, and the sample was placed in the solution for 6 hours. The procedure described in *Langmuir*, 12, 2353-2361 (1996) was followed using three stock solutions: a 1% w/w aqueous solution of hydrogen tetrachloroaurate trihydrate; a 1% w/w aqueous solution of sodium citrate; and a 0.075% w/w solution of sodium borohydride (reducing agent) in 1% aqueous sodium citrate. Gold colloids were prepared by adding 1 mL of the hydrogen tetrachloroaurate solution to 100 mL of Millipore water with vigorous stirring. After 1 minute, 1 mL of the sodium citrate solution was added, and, after another minute, 1 mL of the sodium borohydride solution was added. The system was stirred for and additional 5 minutes, and stored at 4° C. After colloid treatment, the sample was rinsed thoroughly with DI water and allowed to dry. FIG. 8 shows that the gold colloid adheres selectively to the acrylate polymer.

Example 4

Figure 9:
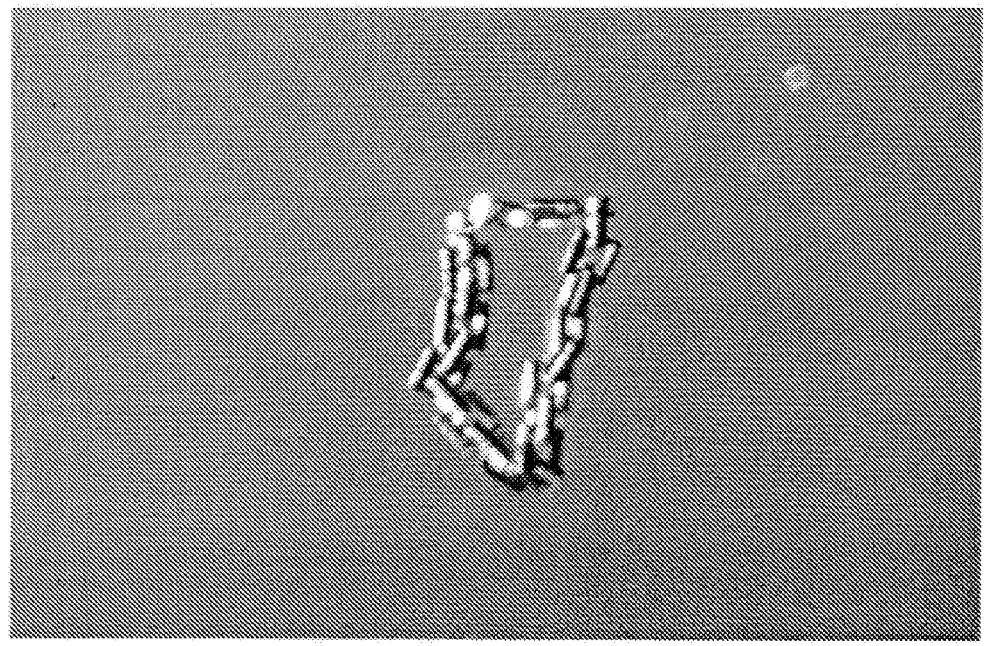
FIG. 9 is a black and white rendering of an optical micrograph of a microstructure.

Polymeric structures were prepared and treated with ethylene diamine as described in Example 1, except that, after the polymer was reacted with the diamine, the polymer was subjected to an aqueous solution of 0.1% w/w hydrogen tetrachloroaurate. The amine reduces the gold onto the polymer surface, which results in a gold plating of the polymer surface (see FIG. 9).

Example 5

Methacrylate modified coverslips were prepared according to the procedure described in Example 1. A sample of nanorods was dispersed on a modified coverslip. There are two different methods by which to produce nanorods. The first method produces nanorods through electrodeposition of metals in porous aluminum oxide and is outlined in *J. Mat. Chem.*, 7(7), 1075-1087 (1997) and *Science*, 294, 137-141 (2001). The second method produces nanorods through electroless deposition of metals in track-etched polycarbonate membranes—the procedure can be found in Anal. Chem., 67, 1920-1928 (1995). The coverslip was then taped to a microscope slide and a drop of acrylate prepolymer resin [0.12 g of Lucirin TPO-L (BASF), 1.72 g of SR368 (Sartomer), and 2.28 g of SR499 (Sartomer)] was placed on the coverslip. A second coverslip was placed on top of the first, effectively sandwiching the resin between the two coverslips with the tape playing the role of a spacer. This system was placed on the optical microscope that was used for polymerization. The nanorods were wired by polymerizing the resin into two lines of 100 microns or more in length, each of which touches one end of the nanorod. After wiring is completed, the sample was removed from the microscope and was rinsed in dimethylformamide (DMF) in order to remove the unpolymerized resin. After thorough washing in DMF, the sample was rinsed with ethanol prior to immersion in a freshly prepared 20% v/v solution of ethylene diamine in ethanol, which was stored in a screw-cap glass jar. The sample was allowed to react for one hour at ambient conditions after which it is washed thoroughly with ethanol. Following the ethanol washes, the sample was immersed in a saturated solution of palladium chloride in methanol (0.12 g of palladium chloride dissolved in 100 mL of methanol), which was filtered prior to use. After one hour, the sample was removed from the palladium solution and rinsed thoroughly first with ethanol followed by complete rinsing with DI water. In order to make the system conductive, the sample was placed in a freshly prepared electroless copper enhancement bath. The enhancement solution was prepared by dissolving 3 g copper sulfate, 4 g sodium hydroxide, and 14 g potassium sodium thiosulfate in water and diluting to 100 mL. A 5:1 mixture of the copper solution and formaldehyde was used as the enhancement bath and was prepared just prior to use. The sample was enhanced in the bath until such time as it became conductive (usually about 30 s). This experiment was performed several times for nanorods that are ~200 μnm in diameter produced by the first method listed in this Example.

Example 6

A set of coverslips is modified with the procedure described in Example 5. A sample of nanorods (to be prepared as discussed in Example 5) is dispersed on a modified coverslip. Dispersion of the nanorods onto the coverslips is accomplished by producing a solution of the nanorods in a solvent that would evaporate quickly at room temperature (dichloromethane, methanol, ethanol, etc.), placing a drop of this solution on the coverslip, and allowing time for the solvent to evaporate. The coverslip is then taped to a microscope slide and a drop of acrylate prepolymer resin containing only monofunctional acrylate monomers and a photoinitiator was placed on the coverslip. A second coverslip is placed on top of the first, effectively sandwiching the resin between the two coverslips with the tape playing the role of a spacer. This system is placed in a Zeiss AxioPlan2 optical microscope that is used for polymerization. The nanorods are wired by polymerizing the resin that resides near the ends of the nanorod. After wiring is completed, the sample is removed from the microscope and rinsed in ethanol in order to remove the unpolymerized resin. After thorough washing in ethanol, the sample is immersed in a 20% v/v solution of ethylene diamine in ethanol. The sample is allowed to react for one hour after which it is washed thoroughly with ethanol. Following the ethanol washes, the sample is immersed in a saturated solution of palladium chloride in methanol (0.12 g of palladium chloride dissolved in 100 mL of methanol), which is filtered prior to use. After one hour, the sample is removed from the palladium solution and rinsed thoroughly with ethanol followed by complete rinsing with DI water. In order to make the system conductive, the sample is placed in a freshly prepared electroless copper enhancement bath. The enhancement solution is prepared dissolving 3 g copper sulfate, 4 g sodium hydroxide, and 14 g potassium sodium thiosulfate in water and diluting to 100 mL. A 5:1 mixture of the copper solution and formaldehyde is used as the enhancement bath and is prepared just prior to use. The sample is enhanced in the bath until such time as it just becomes conductive. The polymer wires are removed from the system by immersion of the sample in toluene. Once the polymer is removed the metal wires that remain were enhanced through further electroless copper plating.

Other embodiments are in the claims.

What is claimed is:
1. An article, comprising:
a first portion formed of a first polymer;
a coating covalently bonded to the first portion, the coating comprising a material different from the first polymer; and
a second portion that is covalently bonded to the first portion and is formed of a second polymer different from the first polymer,
wherein all surfaces of the second portion are substantially free of the coating; and
wherein the article has a maximum dimension of about 100 microns or less.
2. The article of claim 1, wherein the maximum dimension of the article is about 10 microns or less.
3. The article of claim 1, wherein the maximum dimension of the article is about one micron or less.
4. The article of claim 1, wherein the maximum dimension of the article is about 100 nanometers or less.
5. The article of claim 1, wherein the maximum dimension of the article is about 50 nanometers or less.
6. The article of claim 1, wherein the maximum dimension of the article is about 40 nanometers or less.
7. The article of claim 1, wherein the article is in the form of a chain, a coil, a tube, a channel, a reaction vessel, a funnel, a cable, a band gap, a gear, a cantilever, a pipe, a tower or a nanomanipulator.
8. The article of claim 1, wherein the first polymer comprises a material selected from the group consisting of polyacrylates, polymethacrylates, epoxies, polythiophenes, and polystyrenes.
9. The article of claim 1, wherein the coating comprises a material that is electrically conductive, magnetic or both.
10. The article of claim 9, wherein the coating comprises at least one material selected from the group consisting of metals, alloys, polymers and intermetallics.
11. The article of claim 1, wherein the coating comprises a biological compound.
12. The article of claim 11, wherein the coating comprises at least one material selected from the group consisting of oligonucleotides, peptides, proteins, antibodies, enzymes, saccharides and lipids.
13. The article of claim 1, wherein the coating comprises an inorganic material.
14. The article of claim 13, wherein the coating comprises a material selected from the group consisting of metal oxides, metal tellurides and inorganic oxides.

15. The article of claim 1, wherein the first polymer has a first composition, and the second polymer has a second composition that is different from the first composition.

16. The article of claim 1, wherein the first portion includes a functionalized region, and the coating is covalently bonded to the first portion via the functionalized region.

17. The article of claim 16, wherein the functionalized region comprises a reaction product of the polymer with a chemical species selected from the group consisting of thiols, conjugate bases of thiols, amines, conjugate bases of amines and carboxyls.

18. The article of claim 1, wherein the coating has a substantially uniform thickness.

19. The article of claim 16, wherein the functionalized region has a composition that is different from a composition of other regions of the first portion.

20. The article of claim 1, wherein the coating comprises a plurality of openings.

21. The article of claim 19, wherein regions of the coating form a plurality of different electrical current paths between different regions of the first portion.

22. The article of claim 1, wherein the first polymer comprises an organic polymer material.

23. The article of claim 1, wherein the first polymer differs from the second polymer based on surface structures of the first and second polymers.

24. The article of claim 23, wherein the first polymer comprises at least one functionalized surface and the second polymer comprises substantially only unfunctionalized surfaces.

25. The article of claim 1, wherein the first polymer differs from the second polymer based on a chemical reactivity of the first polymer relative to a chemical reactivity of the second polymer.

26. The article of claim 1, wherein the first polymer differs from the second polymer based on interior structures of the first and second polymers.

27. The article of claim 26, wherein the first polymer comprises a functionalized interior region and the second polymer comprises substantially only an unfunctionalized interior region.

* * * * *

UNITED STATES PATENT AND TRADEMARK OFFICE
CERTIFICATE OF CORRECTION

| | | |
|---|---|---|
| PATENT NO. | : 8,298,445 B2 | Page 1 of 1 |
| APPLICATION NO. | : 11/852831 | |
| DATED | : October 30, 2012 | |
| INVENTOR(S) | : John T. Fourkas and Richard A. Farrer | |

It is certified that error appears in the above-identified patent and that said Letters Patent is hereby corrected as shown below:

Column 1
Line 8, delete "0$ 120)" and insert -- § 120) --

Column 13
Line 19, Claim 21, delete "of claim 19" and insert -- of claim 20 --

Signed and Sealed this
Fifteenth Day of January, 2013

David J. Kappos
*Director of the United States Patent and Trademark Office*